(12) United States Patent
Kimerling et al.

(10) Patent No.: US 7,787,176 B2
(45) Date of Patent: Aug. 31, 2010

(54) ON-CHIP OPTICAL AMPLIFIER

(75) Inventors: Lionel C. Kimerling, Concord, MA (US); Kazumi Wada, Lexington, MA (US); Daniel K. Sparacin, Cambridge, MA (US); Desmond R. Lim, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 435 days.

(21) Appl. No.: 10/234,785

(22) Filed: Sep. 4, 2002

(65) Prior Publication Data

US 2003/0048527 A1   Mar. 13, 2003

Related U.S. Application Data

(60) Provisional application No. 60/317,053, filed on Sep. 4, 2001.

(51) Int. Cl.
*H01S 5/00* (2006.01)
*H04B 10/12* (2006.01)

(52) U.S. Cl. .................. 359/344; 359/333
(58) Field of Classification Search .......... 359/333, 359/335, 344
See application file for complete search history.

(56) References Cited

U.S. PATENT DOCUMENTS

| | | | |
|---|---|---|---|
| 3,465,159 A | | 9/1969 | Sten |
| 5,239,410 A | * | 8/1993 | Nishimura et al. .......... 359/344 |
| 5,446,573 A | * | 8/1995 | Lomashevitch et al. ..... 398/175 |
| 5,751,466 A | * | 5/1998 | Dowling et al. ............. 359/248 |
| 5,796,768 A | * | 8/1998 | Mersali et al. ........... 372/45.01 |
| 5,998,298 A | * | 12/1999 | Fleming et al. ............. 438/692 |
| 6,111,472 A | * | 8/2000 | De Los Santos ............. 331/96 |
| 6,219,175 B1 | * | 4/2001 | Yamada ....................... 359/335 |
| 6,301,041 B1 | * | 10/2001 | Yamada ....................... 359/333 |

FOREIGN PATENT DOCUMENTS

JP      02 106 726      4/1990

OTHER PUBLICATIONS

Saleh et al., Fundmentals of Photonics, Wiley, New York, (1991), pp. 248-258.*
Holmstroem, "High -confinement waveguides for mid-IR devices", Physica E, vol. 7, pp. 40-43 (Mar. 20, 2000).*

* cited by examiner

*Primary Examiner*—Eric Bolda
(74) *Attorney, Agent, or Firm*—Gauthier & Connors LLP

(57) ABSTRACT

An on-chip amplifier includes first element that curtails the velocity of an incoming light to the amplifier. A second element is doped so as to make the frequency of the incoming light equal to the electron frequency in order to allow for electron-photon wave interaction, so that when current flows through the amplifier, electron power is transferred to the incoming light, resulting in amplification of the incoming light.

1 Claim, 4 Drawing Sheets

ON-CHIP OPTICAL AMPLIFIER

PRIORITY INFORMATION

This application claims priority from provisional application Ser. No. 60/317,053 filed Sep. 4, 2001.

BACKGROUND OF THE INVENTION

The invention relates to the field of optical amplifiers, and in particular to a solid-state optical amplifier intended for on-chip purposes.

Optical amplifiers are an essential component of optical circuits. As far as optical fiber communication is concerned, the well-developed Er-doped fiber amplifier (EDFA) technology is the platform for signal multiplexing and de-multiplexing in wavelength division multiplexing (WDM). Erbium can be pre-excited by 0.98 or 1.483 µm lasers to amplify incoming light signal by 30 dB without using any other devices. This is one of the many reasons for the widespread application of EDFA technology. However, the size of an EDFA is large and usually has a length of 10 m or longer. For this reason, it is too large to implement the device as an on-chip circuitry.

The semiconductor optical amplifier (SOA) is another possible technology platform that has the added advantage of enabling on-chip integration. In SOA operation, laser diodes are kept in a state with injection slightly lower then lasing. With incoming light, stimulated emission occurs from the laser diode. The bandwidth is determined by thermal fluctuation of the Fermi-Dirac distribution function at room temperature and is similar to the EDFA. The integration of SOA, however, is limited by the following two reasons. First, the SOA needs a high level of carrier injection to achieve population inversion of carriers. Such a current injection results in improper device operation, the so-called heat penalty. Second, SOAs are usually made of III-V semiconductors with direct band gaps, which are not easily implemented in current CMOS Si LSICs technology. Thus, a new type of optical amplifier technology is needed for on-chip integration of electronic and photonic circuits.

SUMMARY OF THE INVENTION

According to one aspect of the invention, there is provided an on-chip amplifier. The on-chip amplifier includes first element that curtails the velocity of an incoming light to the amplifier. A second element that is doped so as to make the frequency of the incoming light equal to the electron frequency in order to allow for electron-photon wave interaction, so that when current flows through the amplifier, electron power is transferred to the incoming light, resulting in amplification of the incoming light.

According to another aspect of the invention, there is provided a method of forming an on-chip amplifier. The method includes providing a first element that curtails the velocity of an incoming light to said amplifier. The method further includes providing a second element that is doped so as to make the frequency of said incoming light equal to the electron frequency in order to allow for electron-photon wave interaction. When current flows through said amplifier, electron power is transferred to said incoming light, resulting in amplification of said incoming light.

DETAILED DESCRIPTION OF THE INVENTION

The invention is an optical amplifier intended for on-chip purposes. The principle on which amplification occurs is analogous to that of the traveling wave vacuum tubes (TWT) in that energy is transferred from electrons to electromagnetic radiation by the wave interactions. The electron-photon interaction occurs in a semiconductor waveguide, as opposed to a spatially separated RF coil around a vacuum tube in the TWT.

There are two requirements for this device. The first requirement is that the waveguide is doped so as to make the frequency of the incoming light equal to the electron frequency, such as plasma or fermi frequencies. The second requirement is that the velocity of the light in the structure must be curtailed in order to allow for the electron-photon wave interaction. When current is flowed through the device, electron power is transferred to the light, resulting in amplification of the light. This phenomenon allows for the following device functions, such as switches, wavelength filters, and light emitters.

Since the amplifier uses monopolar carriers, direct band gap semiconductors are not necessary. The various amplifiers functions are tunable by means of changing carrier density in the amplifier using the following techniques, such as waveguides with frequency cut-offs, grating structures, and photonic bandgap structures. The incoming light is in the TM mode with an electric field whose plasma frequency can be achieved by doping without saturation and whose band gap is large enough to not absorb the incoming light, such as silicon (Si) and Gallium Nitride (GaN) including most compound semiconductors.

Figure 1A:
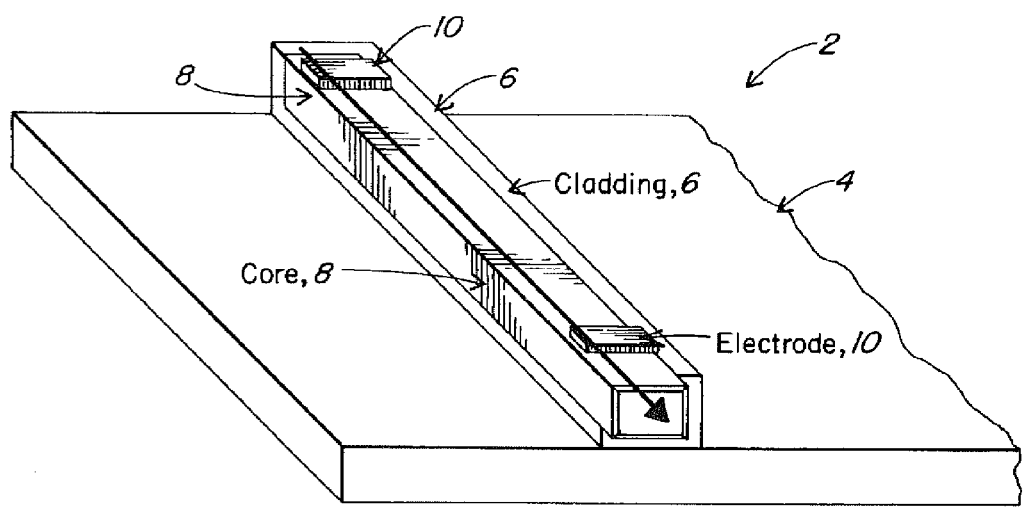
FIGS. 1A and 1B are schematic diagrams of waveguide amplifiers.
Figure 1B:
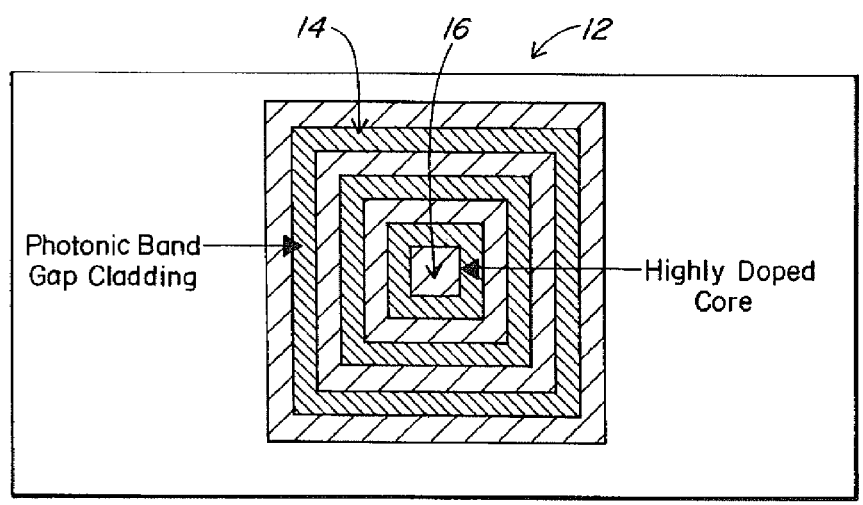

FIGS. 1A and 1B are schematic diagrams of waveguide amplifiers. The first structure 2, as shown in FIG. 1A, includes a semiconductor substrate 4, a highly doped cladding 6, a core 8, and electrodes 10. Although the core 8 and cladding 6 are doped semiconductors, there is no need for the two to be the same semiconductor material. In this case, the cladding 6 is highly doped to achieve the plasma frequency, which is defined as $$\omega_p^2 = Ne^2/\epsilon_r \epsilon_0 m^* \qquad \text{Eq. 1}$$

where N is the number of electrons, e is the elemental charge, $\epsilon_r$ is the relative dielectric constant, $\epsilon_0$ is the vacuum permittivity, and $m^*$ is the effective mass of electrons.

For the case of using the fermi frequency, the fermi frequency is defined as $$\omega_F = h/m^* (3\pi^2 N)^{2/3} \qquad \text{Eq. 2}$$

where h is the Plank's constant.

The second proposed waveguide amplifier structure 12 is detailed in FIG. 1B. In this embodiment, a core 16 is highly doped to achieve the plasma frequency. Creating a waveguide structure with such a core 16 is difficult using conventional methods due to the extremely low index of refraction associate with a material at the plasma frequency. In order to confine light in a waveguide, the core 16 must have a higher index of refraction than the cladding 14. To overcome this problem, the use of photonic band gap or metal as the cladding 14. With proper design, the light can be confined in the core 16 by metal or a photonic band gap (PBG), thereby enhancing the electron-photon interaction.

The use of doped silicon for the core 16 and a PBG made of silicon and silicon dioxide is one possible and realizable materials platform on which to make the device 12. In terms of manufacturing, the latter waveguide amplifier 2 is simpler to make using deposition and lithography techniques.

The basic operation of the structures 2 and 12 is generally simple. Without a current, both waveguides structures 2 and 12 act as broken circuits. In the first structure 2, light is attenuated due to the free carrier absorption of the evanescent tails in the cladding 6. The refractive index of the cladding 6 has a small real part but a large imaginary part due to these free carriers. Light transmission occurs through part of the structure 2 until the optical signal is attenuated.

In the second structure 12, the doped core 16 acts as a reflector and does not permit the transmittance of light. Both structures 2 and 12 have the limitation that the length must be longer than the skin depth, which is defined as $$sk = (2\sigma_0 \mu_0 \omega)^{-1/2} \quad \text{Eq. 3}$$

where $\sigma_0$ is the conductivity of the material, $\mu_0$ is the permeability of free space, and $\omega$ is the frequency of the light. Additionally, the plasma frequency doping allows for a quicker electron-photon interaction. Furthermore, Equation 3 defines the minimum thickness of a material that results in the full attenuation of a give optical signal.

When current flows through the waveguide structure 12, the doped region 16 is depleted and light is transmitted. By properly designing the waveguide structure 12 and tuning frequency of the incoming light, the velocities and frequencies of the photons and electrons will be comparable so as to promote wave interactions, similar to the TWT. In this case, it is possible to transfer power from the electrons to the photons, resulting in the amplification of the optical signal. The amount of amplification is dependant on the amount of current, length of the device, and the electron-photon velocity ratio.

Figure 2:
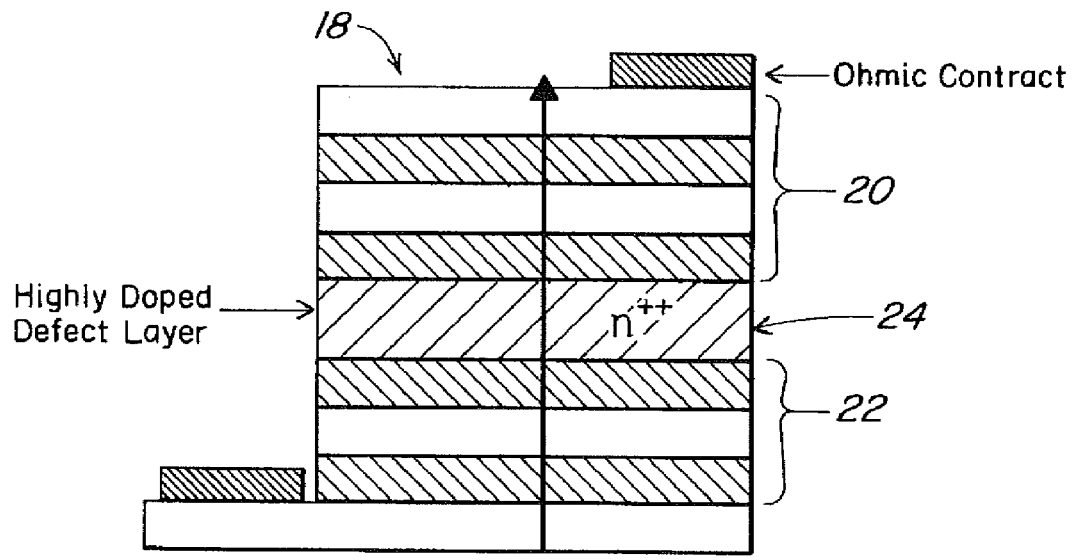
FIG. 2 is a schematic diagram of a photonic band gap amplifier.

FIG. 2 is a schematic diagram of a photonic band gap amplifier 18. The photonic band gap amplifier 18 uses the same concept as the waveguide amplifiers 2 and 12, but with a totally different structure. In this device, a one-dimensional photonic bang gap (PBG) is used with a highly doped defect layer 24. The photonic band gap amplifier 18 also uses alternating layers 20 of optically transparent materials with different dielectric constants or what is known as a PBG to curtail the velocity of the light.

Essentially, the PBG creates a potential barrier for the photons, most photons reside in the defect layer 24 for many reflections. If a defect layer 24 is put in the middle of this dielectric stack, most of the slow photons will reside in the defect layer 24 for many reflections. Doping the defect layer 24 and sending a current through the entire structure 18 can achieve amplification. The doping should be such that the plasma frequency is equal to the frequency of the optical signal. The multiple reflection and light velocity reduction increase the electron-photon interaction time. Comparable to the waveguide structures 2 and 12, the photon band gap amplifier 18 acts as an open circuit when there is no current passing through the structure, because the doped layer 24 acts as a mirror.

Finding two compatible, optically transparent, and electrically conductive materials with an appreciable index of refraction is a necessity for building this structure, the invention can use Zinc Oxide or Indium-Tin Oxide with Silicon. Similar to the waveguide amplifiers 2 and 12, described hereinbefore, the amount of amplification depends on the amount of current and the electron-photon velocity ratio. Additionally, the larger the number of layers in the PBG amplifier 18, the index contrast will increase the amount of electron-photon interaction, but reduce light transmission.

Figure 3:
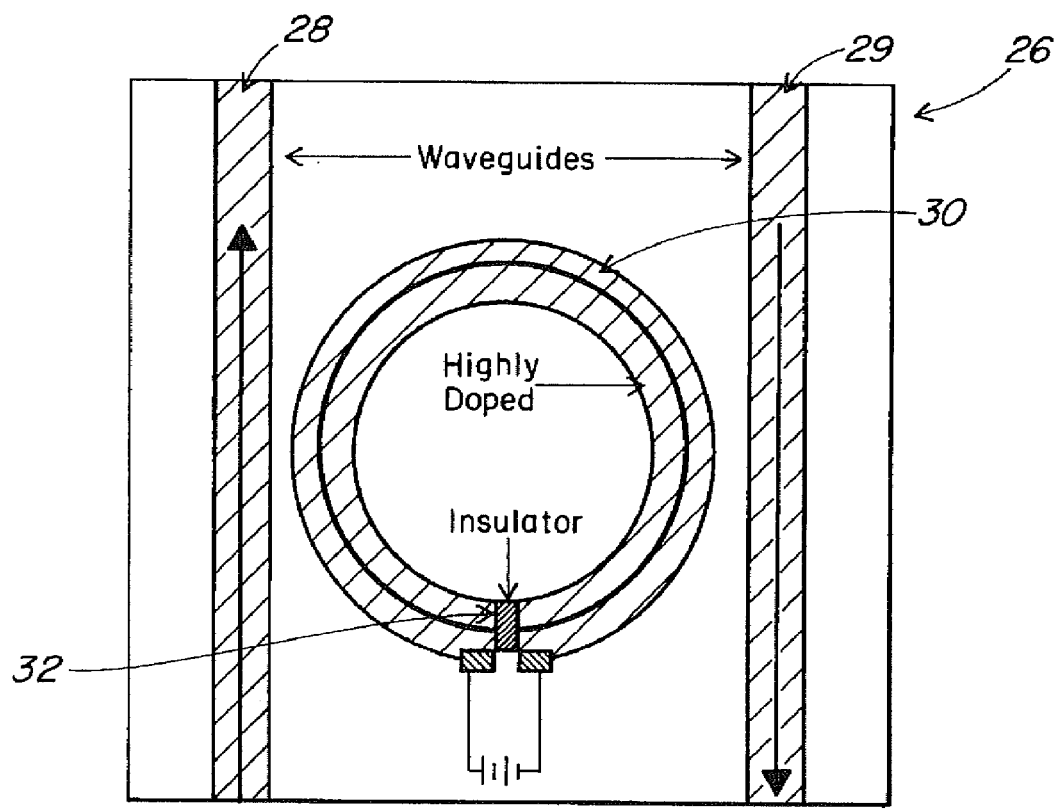
FIG. 3 is a schematic diagram of another amplifying device that utilizes a ring resonator structure.

FIG. 3 is a schematic diagram of another amplifying device that utilizes a ring resonator structure. A ring resonator structure 26 is a structure that is used to transfer light from one waveguide to another. Light is coupled into a ring 30 and then after several cycles, coupled into either one of the adjacent waveguides 28 or 29, as shown in FIG. 3. By properly designing the circumference and cross-section of the ring resonator 26, the photons from the incoming signal can be slowed down due to the dispersion relation that is found in waveguide structures 28 and 29.

The innovative alteration applied to the ring resonator structure 26 is that a small section of insulator 32 in the ring 30 to allow for the current to flow around the ring 30. The insulator 32 should be transparent to the light, and serve as a barrier for electron conduction. The ring 30 should be heavily doped so as to have the plasma frequency equal to the incoming light's frequency, which aids in the electron-photon interaction. When a current flows through the ring 30 and light is coupled in from the waveguide 28 or 29, the signal will be amplified during each cycle it is inside the ring 30 before it is coupled out. Electron-photon interactions are increased if the ring resonator amplifier 26 has a high Quality factor, which means that the light is trapped in ring 30 for many cycles.

Without a current, no light will be coupled into the ring 30, thus preventing amplification. However, with a current, the light can be coupled into the ring 30, amplified, and coupled again into a new waveguide as an amplified signal. One unique property of the ring resonator amplifier 26 is that light can be used whether or not there is a current. If there is no current, the light continues to travel down the first waveguide, but if there is a current, the light is coupled into a different waveguide. By varying the amount of current, active tuning is possible, enabling it to be used as a signal splitter, for example.

Figure 4:
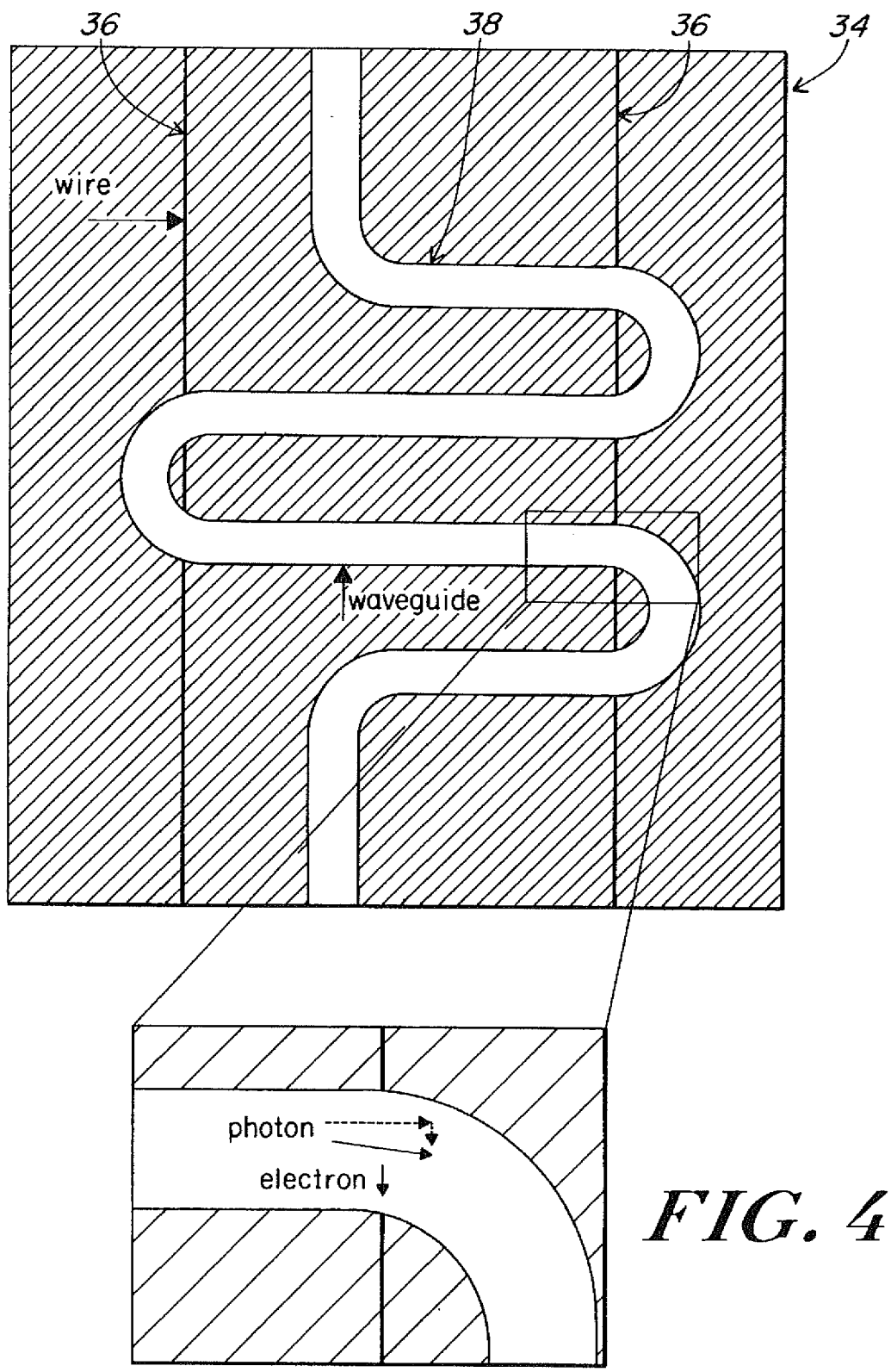
FIG. 4 is a schematic diagram of a phase velocity amplifier.

FIG. 4 is a schematic diagram of a phase velocity amplifier 34. The phase velocity amplifier 34 is essentially a traveling wave tube on a chip. The principle on which wave interactions occur is by matching the phase velocity of the optical signal with the velocity of electrons flowing in the waveguide. The structure of the phase velocity amplifier 34 is an electrically conducting waveguide 38 that curves back and forth in a drainpipe fashion, as shown in FIG. 4. Electrically conducting wires 36 intersect the waveguide 38 at the beginning of each bend. By properly positioning the wires 36, the velocity of the electrons and the phase velocity component of the photons, in the direction parallel to the flow of electrons, will be matched allowing for wave interactions and ultimately light amplification. Positioning of the wire-waveguide intersection is dependant on the electron-photon velocity mismatch.

The amount of amplification is dependent on the number of turns and the conductivity of the waveguide 38. The phase velocity amplifier will act as an amplifier when current is flowed through the wire. When there is no current in the wires, the device acts as a regular waveguide. The waveguide 38 must be made of an optically transparent and electrically conductive material; many semiconductors meet these criteria. In terms of processing, the phase velocity amplifier 24 is very easy to make using current CMOS lithography methods.

To enhance the electron-photon interaction, the sections of the waveguide where the current passes through can be doped so as to reach the plasma frequency of the optical signal. In this case, the phase velocity amplifier 34 can prevent light propagation without the presence of a current flowing.

Figure 5:
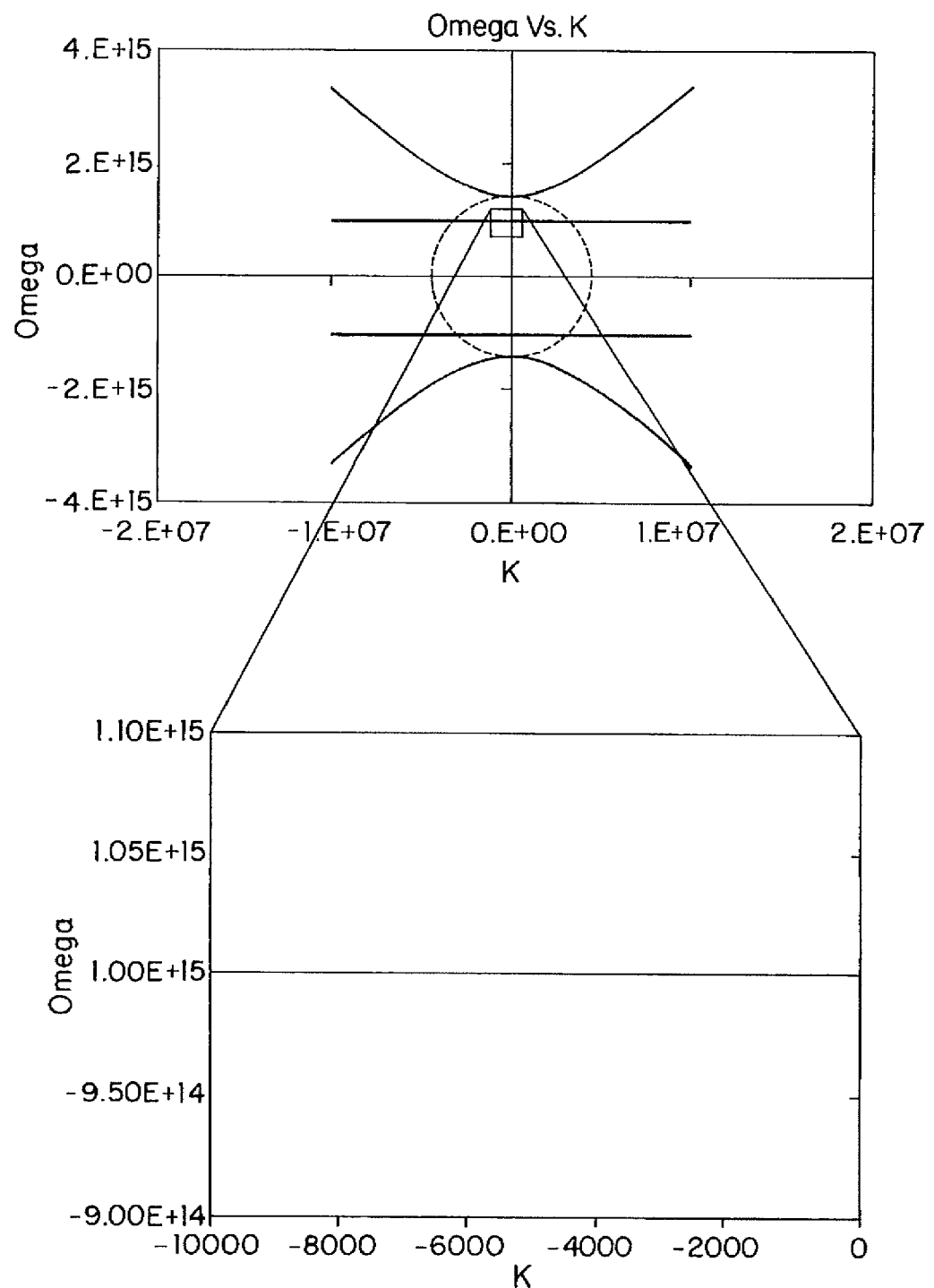
FIG. 5 is a graph of dispersion of a waveguide structure using the amplification devices.

FIG. 5 is a graph of dispersion using the amplification devices described hereinbefore. The invention uses the following principles to enhance the photon-electron interaction by reducing light in the on-chip device and frequency matching of electrons to that of light. The main reason light weakly interacts with matter is due to the electron-photon velocity mismatch. In other words, light is approximately one thousand times faster than electrons in semiconductors. However, once the velocity of light is similar to the electrons, the electron-photon interaction becomes strong. This is well known and is a crucial operating aspect of the traveling wave tube. Light amplification of up to 70 dB occurs in the traveling wave tubes. The second criteria needed for amplification is frequency matching to allow for wave coupling between the electrons and light. In traveling wave tubes, an electron beam is accelerated in a vacuum tube in order to match the light frequency.

One solution to reducing the velocity of light in semiconductors is to utilize a "frequency cut-off" associated with the waveguide structures 2 and 12, as shown in FIGS. 1A and 1B. Other methods include the photonic band gap resonator structures 18, as shown in FIG. 2, the ring resonator structure 26, as shown in FIG. 3, or the phase velocity amplifier 34, as shown in FIG. 4. Following Mizushima's methods, the governing equation of amplification for waveguide structures can be shown as follows $$\omega^4 - (2kv_0)\omega^3 + (v_0^2 k^2 - 2\omega_p^2 - k^2 c^2 - \omega_c^2)\omega^2 + \quad \text{Eq. 4}$$
$$(2k^3 c^2 v_0 + 2\omega_p^2 kv_0 + 2\omega_c^2 kv_0)\omega +$$
$$\left( \begin{array}{c} k^2 c^2 \omega_p^2 - k^4 c^2 v_0^2 - \omega_p^2 v_0^2 k^2 + \\ \omega_p^4 + \omega_p^2 \omega_c^2 - \omega_c^2 v_0^2 k^2 - (\omega_c^2 v_0^2 \omega_p^2) c^{-2} \end{array} \right) = 0$$

where $\omega$ and k are the angular frequency and wave vector of the light in semiconductor waveguides, $v_0$ and c are the velocity of the electrons and photons in the waveguides, $\omega_p$ and $\omega_c$ are the plasma frequency and cut-off frequency of the waveguide with plasmon defined by $(\omega_p^2 + \omega_{wc}^2)^{1/2}$, and $\omega_{wc}$ is the cut-off frequency of the waveguide without plasmons.

It should be noted that the TM polarization is used for the light in the structure when calculating Equation 4. The TM mode is chosen because it allows the E-field to oscillate in the same direction as the electrons when a current is flowed through the device. Here, it is assumed that $\omega_p$ is equal to $\omega_{wc}$.

FIG. 5 demonstrates a real state, which is generated in the optical band stop; the dashed lines are imaginary solutions for the light inside the stop band. The two parallel lines correlate to the presence of a current, where the slope $(d\omega/dk)$ is equal to the input value of the electron velocity. The two parabolas are the characteristic wave dispersion plots of light in a waveguide. The enlarged view only occurs when there is current, indicating an interaction between the electrons and the photons. Amplification occurs as a result of the accelerating and decelerating of the light and electron velocities when the two waves interact. This phenomenon results in a larger positive imaginary k-vector magnitude than the negative imaginary k-vector for a given optical frequency, which means that gain coefficient is larger than the attenuation coefficient. It is the objective of the invention to produce new devices that take advantage of this phenomenon.

The invention allows new devices, such switches, wavelength filters, and light emitters, to be formed using Si due to its ease of integration with CMOS technology. In terms of device performance, GaN acts better because of its low electron mass and dielectric constant, which reduces carrier density to achieve a given plasma frequency. An alternative approach to reducing carrier density is using harmonic frequencies for a given optical frequency. By using the second harmonic, the amount of doping needed is half, for the third harmonic the doping needed is one third, and so on. Each of these new devices can be tuned by means of changing the carrier density flowing in the waveguide structures. Since these new devices operate due to monopolar carriers, the use of semiconductors with direct bandgaps are not necessary.

One of these new devices can be a modulator. Structurally, a modulator is nearly the same as the waveguide amplifiers 2 and 12, as described hereinbefore, and is a controlled light valve that opens and closes because of the application of a current. The modulator operates due to the plasma frequency. If the plasma frequency of the incoming electromagnetic wave is less than a material's plasma frequency, the material reflects the wave. This occurs when there is no current flowing through the material due to the presence of a real state in the waveguides stop band. Such behavior can be achieved by doping a waveguide so that the plasma frequency is higher than the frequency of the light to be modulated. Ultimately, a voltage controller can tune the rate of modulation, for example, up to 10 GHz modulation rates.

A modulator can be made using the photonic band gap structure 18, and the ring resonator structure 26, as described hereinbefore. The major difference between the photonic band gap modulator and a waveguide modulator is the structure. Both modulators have doped section of semiconductor that have a plasma frequency higher than the frequency of the light being modulated, leading to a modulation when the current is flowed through the modulator. The photonic band gap structure 18 has the added benefit of a longer electron-photon interaction time. The ring resonator structure 26 has the uniqueness of having two outputs.

A filter can be formed using the amplifier devices 2, 12, 18, and 26 described hereinbefore. In general, a filter is similar to the modulator in its operational mechanism. Depending on the doping, the filter will reflect certain wavelengths while allowing other wavelengths to propagate due to the plasma frequency. Light with frequencies that are greater than the plasma frequency will propagate through the filter, but frequencies that are less will be reflected and filtered out. Essentially, the filter is the modulator left in the off position. The filter can be removed by flowing a current through the device, similar to the modulator, allowing light to propagate. Additionally, the filter can act as an active device, if very large carrier currents are applied. By increasing the charge density in the device with large carrier currents, the effective plasma frequency increases, allowing for frequency tuning of the filter.

Each of the structures 2, 12, 18, and 26 can also be used as delay lines. This is due to the need for the amplifiers to reduce the velocity of the light. Using the structures 2, 12, 18, and 26 as a delay line will enable on-chip registration of optical signals.

The waveguide structures 2 and 12 can be used as switches. Basically, the switching function is a subset of the modulator function. If the light frequency of the incoming electromagnetic wave is less than the highly doped section of the waveguide's plasma frequency, the light does not pass through the waveguide structure. This occurs when there is no current flowing through the structure. However, when the current does flow, the incoming light propagates through the material due to the presence of a real state in the waveguide's stop band. By turning the current that flows through the device on and off, one can thus switch the flow of light on or off.

Also, a detector can be formed using the waveguide structures 2 and 12 described hereinbefore. A detector can be an amplifier that is used in a reversed fashion. In the detector, the current is measured when light strikes the doped section of the waveguide structures 2 and 12. When the light meets the highly doped semiconductor, some of the power from the photons will excite the electrons into the conduction band. The excited electrons will flow due to the diffusion and will create a current. The amount of current will be proportional to the light's frequency and semiconductor resistance.

An isolator is another device that can be formed using the structures 2, 12, 18, and 24 described hereinbefore, and is a device that only lets light transmit in one direction. In other words, the isolator is an unidirectional waveguide. Evidence for this behavior can be seen in FIG. 5. The electrons are moving in the same direction as the photons, resulting in a real state in the waveguide stop bands. The sign of the interaction state is noteworthy because it indicates that only waves with negative k-vectors are allowed to propagate. The entire interaction curve shown in the enlarged view of FIG. 5 is on the negative k-vector side, there is no positive k-vector state within the stop band. In this case, only waves moving in the opposite direction as the electrons can propagate through the structure. Similarly, if the electrons are moving in the opposite direction as photons, the k-vector side is reflected about the abscissa, and only positive k-vectors are allowed to propagate. The isolator can be an active device, by switching the direction of the current, the unidirectional direction of the isolator changes. Such a device can be necessary for an optical chip, where back reflections of optical signals can compromise the functionality of optical devices.

Although the present invention has been shown and described with respect to several preferred embodiments thereof, various changes, omissions and additions to the form and detail thereof, may be made therein, without departing from the spirit and scope of the invention.

What is claimed is:

1. An on-chip amplifier comprising:
   A photonic bandgap (PBG) structure that receives an incoming light signal while current flows through said PBG structure resulting in amplification of said incoming light,
   said PBG structure having a doped defect layer positioned between alternating layers of electrically conductive optically transparent materials comprising different dielectric constants,
   said doped defect layer is doped without saturation to have a plasma frequency,
   said PBG structure is configured so that incoming light propagates in the TM mode and said incoming light has a frequency that is substantially similar to said plasma frequency, and a part of said light signal is repeatedly reflected in the doped defect layer such that electron photon wave interaction is enhanced in the doped defect layer.

* * * * *